US008235477B2

(12) United States Patent
Cunha (10) Patent No.: US 8,235,477 B2
(45) Date of Patent: Aug. 7, 2012

(54) CONTROLLED INSERTION AND RETRACTION OF AN ELECTRONIC MODULE IN A CABINET (75) Inventor: Karl H. Cunha, Colorado Springs, CO (US)

(73) Assignee: Seagate Technology LLC, Scotts Valley, CA (US)

(*) Notice: Subject to any disclaimer, the term of this patent is extended or adjusted under 35 U.S.C. 154(b) by 1058 days.

(21) Appl. No.: 10/884,030

(22) Filed: Jul. 2, 2004

(65) Prior Publication Data
US 2006/0002094 A1 Jan. 5, 2006

(51) Int. Cl.
A47B 95/00 (2006.01)

(52) U.S. Cl. ............ 312/333; 312/223.2; 361/679.43; 361/726

(58) Field of Classification Search ............ 312/223.2, 312/333, 332.1; 292/240–242; 361/685, 361/724–727, 679.43; 211/43, 84, 183
See application file for complete search history.

(56) References Cited

U.S. PATENT DOCUMENTS

| 2,944,864 | A | * | 7/1960 | Krivulka | 312/332.1 |
|---|---|---|---|---|---|
| 3,120,412 | A | * | 2/1964 | Caldwell | 312/332.1 |
| 3,619,019 | A | * | 11/1971 | Hepker | 312/332.1 |
| 4,669,616 | A | | 6/1987 | Mazura | |
| 4,780,570 | A | * | 10/1988 | Chuck | 174/369 |
| 5,019,948 | A | | 5/1991 | Steketee et al. | |
| 5,135,410 | A | * | 8/1992 | Kawase et al. | 439/372 |
| 5,269,698 | A | * | 12/1993 | Singer | 439/157 |
| 5,424,910 | A | * | 6/1995 | Lees | 361/615 |
| 5,491,613 | A | * | 2/1996 | Petitpierre | 361/800 |
| 5,518,412 | A | * | 5/1996 | Larabell | 439/157 |
| 5,534,662 | A | * | 7/1996 | Peacock et al. | 174/355 |
| 5,588,728 | A | * | 12/1996 | Eldridge et al. | 312/332.1 |
| 5,652,697 | A | | 7/1997 | Le | |
| 5,738,226 | A | | 4/1998 | Dean | |
| 5,790,373 | A | * | 8/1998 | Kim et al. | 361/685 |
| 5,889,650 | A | | 3/1999 | Bertilsson et al. | |
| 5,974,490 | A | | 10/1999 | Fujimura et al. | |
| 6,172,880 | B1 | * | 1/2001 | Petitpierre et al. | 361/801 |
| 6,243,790 | B1 | | 6/2001 | Yorimitsu | |
| 6,246,580 | B1 | * | 6/2001 | Weng | 361/695 |
| 6,285,548 | B1 | * | 9/2001 | Hamlet et al. | 361/695 |
| 6,317,329 | B1 | | 11/2001 | Dowdy et al. | |
| 6,349,043 | B1 | * | 2/2002 | Jensen et al. | 361/818 |
| 6,356,457 | B1 | | 3/2002 | Haworth | |
| 6,373,712 | B1 | | 4/2002 | Bailis et al. | |
| 6,498,723 | B1 | * | 12/2002 | Konshak et al. | 361/685 |
| 6,522,553 | B2 | | 2/2003 | Hardin et al. | |
| 6,549,424 | B1 | * | 4/2003 | Beseth et al. | 361/801 |
| 6,639,145 | B1 | * | 10/2003 | Nurmi | 174/387 |
| 6,693,798 | B1 | * | 2/2004 | Conn et al. | 361/754 |
| 6,707,670 | B2 | | 3/2004 | Seal | |

* cited by examiner

Primary Examiner — Hanh V Tran
(74) Attorney, Agent, or Firm — Hall Estill Attorneys at Law (57) ABSTRACT A controlled insertion device is provided for securing an electronic module in a cabinet, the device comprising a strike fixable to the cabinet and a latch engageable with the strike for imparting a longitudinal insertion force on the module for making an electrical connection while simultaneously imparting a lateral retention force on the cabinet defining a preselected clearance between the module and the cabinet.

7 Claims, 7 Drawing Sheets

CONTROLLED INSERTION AND RETRACTION OF AN ELECTRONIC MODULE IN A CABINET

FIELD OF THE INVENTION

The embodiments of the present invention relate generally to the field of electronics cabinet systems and more particularly but without limitation to a system providing controlled insertion forces on a module during electrical connection while simultaneously urging the supporting cabinet in electrical connection with electromagnetic interference containment measures.

BACKGROUND

Ever-increasing demand for data storage capacity has fostered the development of improved data array storage systems wherein a plurality of data storage devices are electronically linked to function synergistically. Data integrity schemes are also enhanced in such arrays permitting fail-safe redundant storage of data, such as in redundant arrays of independent device ("RAID") systems.

There are a number of challenges facing the array designer. For example, the many and complex mechanical and electrical connections required for each data storage device are multiplied by the number in an array. That is, each and every data storage device requires sufficient mechanical support to isolate the delicate head and disc components from vibration levels that create data transfer errors. Not only must attention be paid to self-excitation, that is, vibration caused by the rotating disc of a data storage device itself, but like attention is required to external excitation sources in such an environment. External excitation can come from other data storage devices in the array, electrical components in the array such as power supplies and fans, and from the installation and/or removal of data storage devices while the array is operational.

As the number of data storage devices in arrays increases, the problems associated with electromagnetic interference containment are exacerbated as well. Properly shielding the data storage devices requires attention paid not only to leak paths between drives in adjacent shelves, but also to the leak paths potentially created by the multiple openings into which each of the plurality of data storage devices is inserted. Adequate shielding of these openings must be provided while still permitting the ability to insert and/or remove a data storage device without disrupting the shielding in place for adjacent data storage devices in the array.

Flexibility can be a problem as well. For instance, traditionally the electrical systems, such as the connector boards, controllers, and connecting buses, are hard-wired for a predetermined number and size of data storage devices in the array. This is required to maintain the electrical integrity of the array while permitting swapping of individual data storage devices. For this reason, the storage shelves and the associated electrical systems are dedicated for the predetermined number and size of data storage devices. Accordingly, because of both mechanical and electrical constraints, an array designed for a particular form factor configuration cannot readily be adapted for use with a different form factor. Also, if a grouping of data storage devices is needed for a particular function, such as mirroring the storage of data, such functionality must conventionally be achieved at the top level host programming level. This requires complex and coordinated programming of many data storage devices.

While various approaches have been proposed in the art to address maximizing the data storage capacity while also providing operable flexibility in the utilization of data storage devices in array storage systems, there nevertheless remains a continued need for improvements in the art. It is to such improvements that the claimed invention is directed.

SUMMARY OF THE INVENTION

In accordance with preferred embodiments, an apparatus and method are provided for engaging an electronic module in an electronics cabinet.

In some embodiments a locking device is provided comprising a fixed strike and a pivotal latch, the latch defining an open-ended slot that clearingly disengages the strike in an open position of the latch, and receivingly engages the strike in a closed position of the latch to pressingly engage against first and second nonplanar engagement surfaces of the strike.

In some embodiments a controlled insertion device is provided for securing an electronic module in a cabinet, the device comprising a strike fixable to the cabinet and a latch engageable with the strike for imparting a longitudinal insertion force on the module for making an electrical connection while simultaneously imparting a lateral retention force on the cabinet defining a preselected clearance between the module and the cabinet.

In some embodiments a cabinet is provided establishing electromagnetic interference shielding by steps for engaging an electronic module within a cabinet opening.

These and various other features and advantages which characterize the claimed invention will become apparent upon reading the following detailed description and upon reviewing the associated drawings.

DETAILED DESCRIPTION

Figure 1:
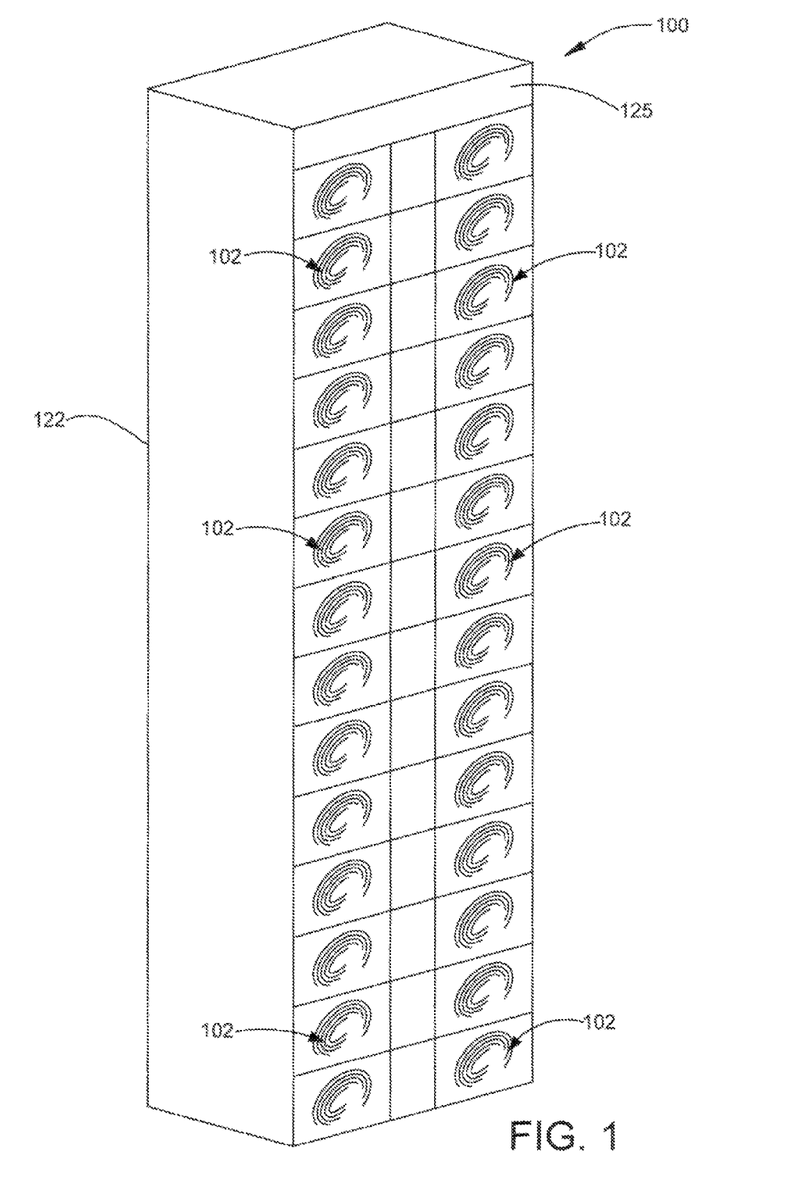
FIG. 1 is an isometric view of an array storage system constructed in accordance with embodiments of the present invention.
Figure 2:
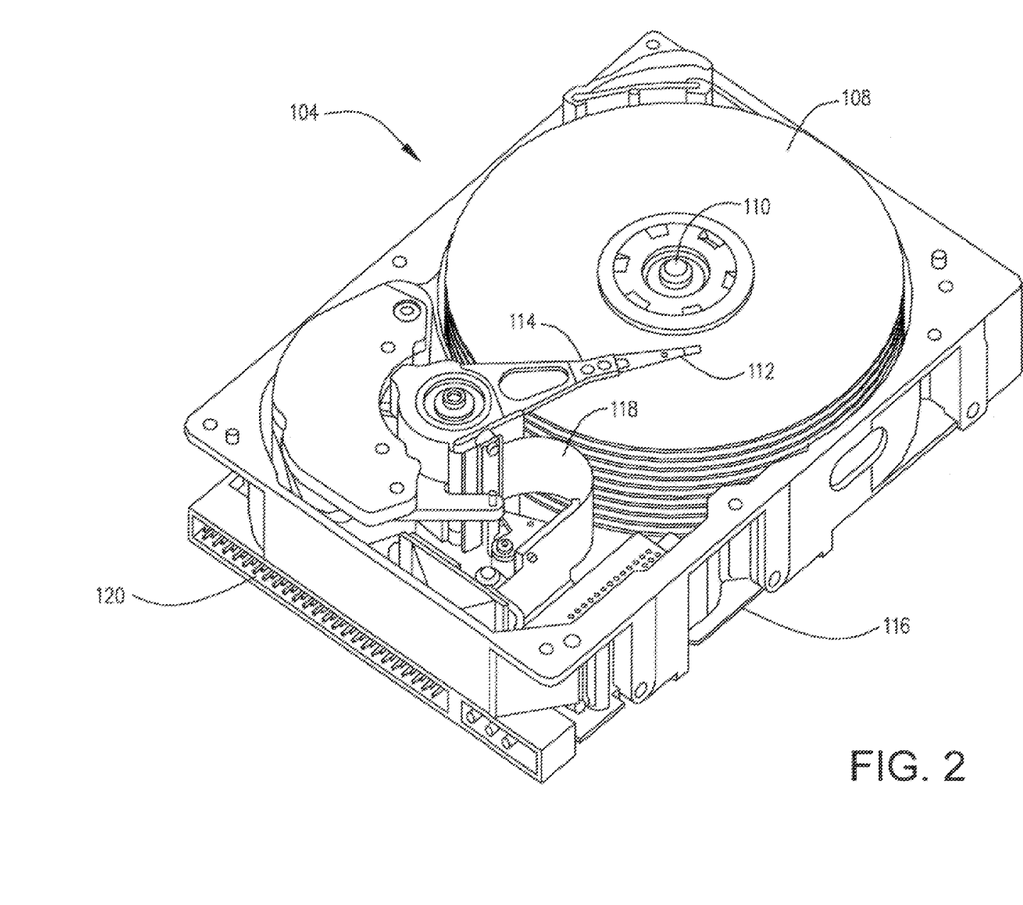
FIG. 2 is an isometric view of a data storage device suited for use in the array storage system of FIG. 1.
Figure 3:
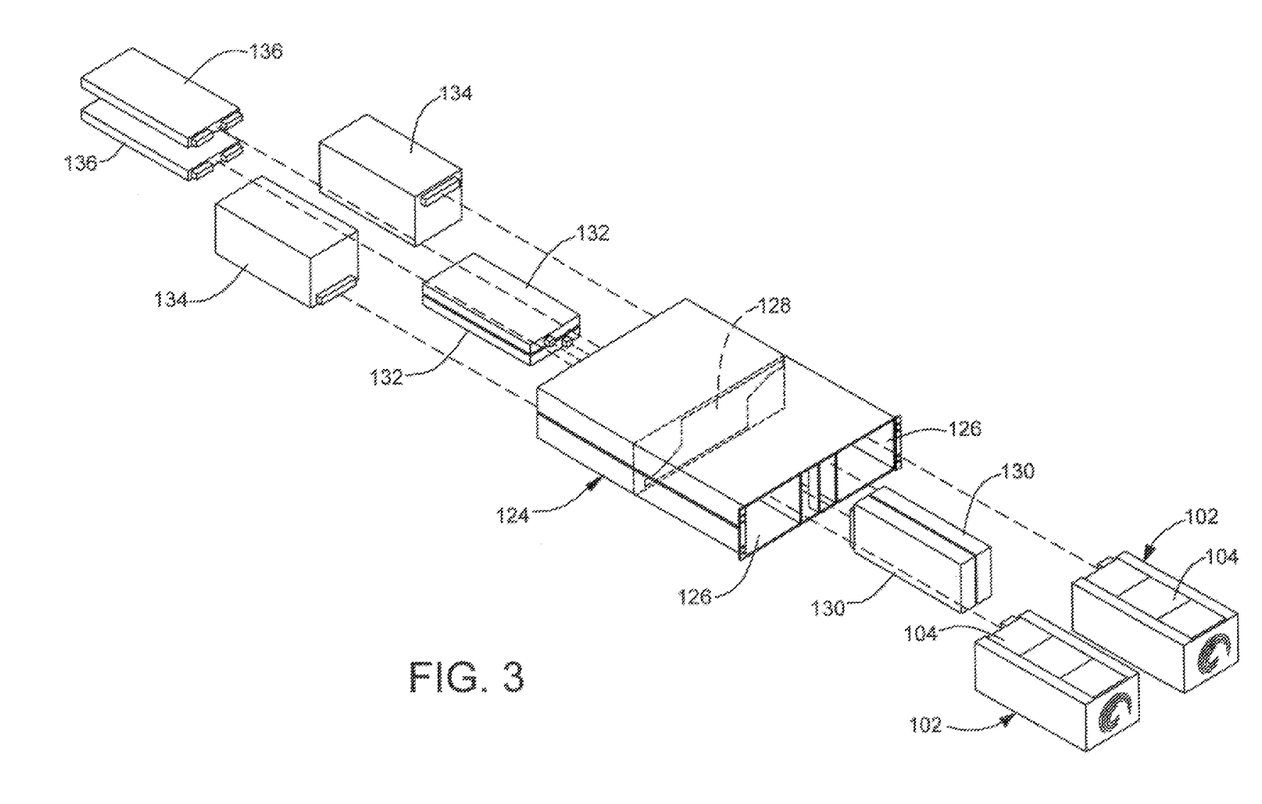
FIG. 3 is an exploded isometric view of a portion of the array storage system of FIG. 1.

FIGS. 1-3 illustrate an array storage system ("array") 100 constructed in accordance with novel embodiments of the present invention, wherein a plurality of multiple disc arrays ("MDAs") 102 are employed, each comprising a number of data storage devices 104. An MDA 102 generally comprises a convertible plurality of componentized data storage devices 104. By "convertible" it is meant that one or more data storage devices 104 can be readily replaced, added, or removed in an existing MDA 102, or that a different MDA can be utilized that is capable of supporting a different number, size or arrangement of data storage devices. By "componentized" it is meant that the data storage devices 104 and associated control electronics in the MDA 102 are integrated so as to be functionally presented to the array 100 as a single component.

FIG. 2 is an isometric view of a data storage device 104 suited for use in the MDA 102, being in the form of a rotating magnetic media disc drive. A data storage disc 108 is rotated by a motor 110 to present data storage locations of the disc 108 to a read/write head ("head") 112. The head 112 is supported at the distal end of a rotary actuator 114 that is capable of moving the head 112 radially between inner and outer tracks of the disc 108. The head 112 is electrically connected to a circuit board 116 by way of a flex circuit 118. The circuit board 116 is adapted to receive and send control signals controlling the functions of the data storage device 104. A connector 120 is electrically connected to the circuit board 116, and is adapted for connecting the data storage device 104 with control electronics of the array 100.

A cabinet 122 defines a plurality of cavities into each of which a shelf 124 is receivingly engaged. A host 125 is electrically connected to each of the data storage devices 104 so as to provide a bulk data storage arrangement, such as for providing a network interface and/or for employing data integrity schemes such as in a RAID system. Each shelf 124 defines one or more cavities 126 into each of which an MDA 102 is receivingly engaged for electrical engagement with a backplane 128. Similarly, the shelf 124 defines cavities for receivingly engaging other electrical modules with the backplane 128 such as, but not limited to, controllers 130, batteries 132, power supplies 134, and interfaces 136.

In the illustrative embodiment of FIG. 3, the shelf 124 defines two cavities 126 for receiving two MDAs 102. Equivalent alternative embodiments contemplate a different number of MDAs 102 per shelf 124. The array 100 comprises a plurality of MDAs 102, each sized in accordance with the respective cavity 126 for an operable mating relationship. Each MDA 102 is adapted to operably support a variable number, size, or arrangement of data storage devices 104. More particularly, this solution provides an array 100 comprising a shelf 124 for receivingly engaging an MDA 102 comprising a carrier from a plurality of different carriers, each carrier of the plurality having common exterior dimensions defining an operable mating relationship with the cavity 126 of the shelf 124, and each carrier of the plurality differentiated by interior supporting features for supporting a selected number, size, or arrangement of data storage devices 104.

Figures 4, 6, 7:
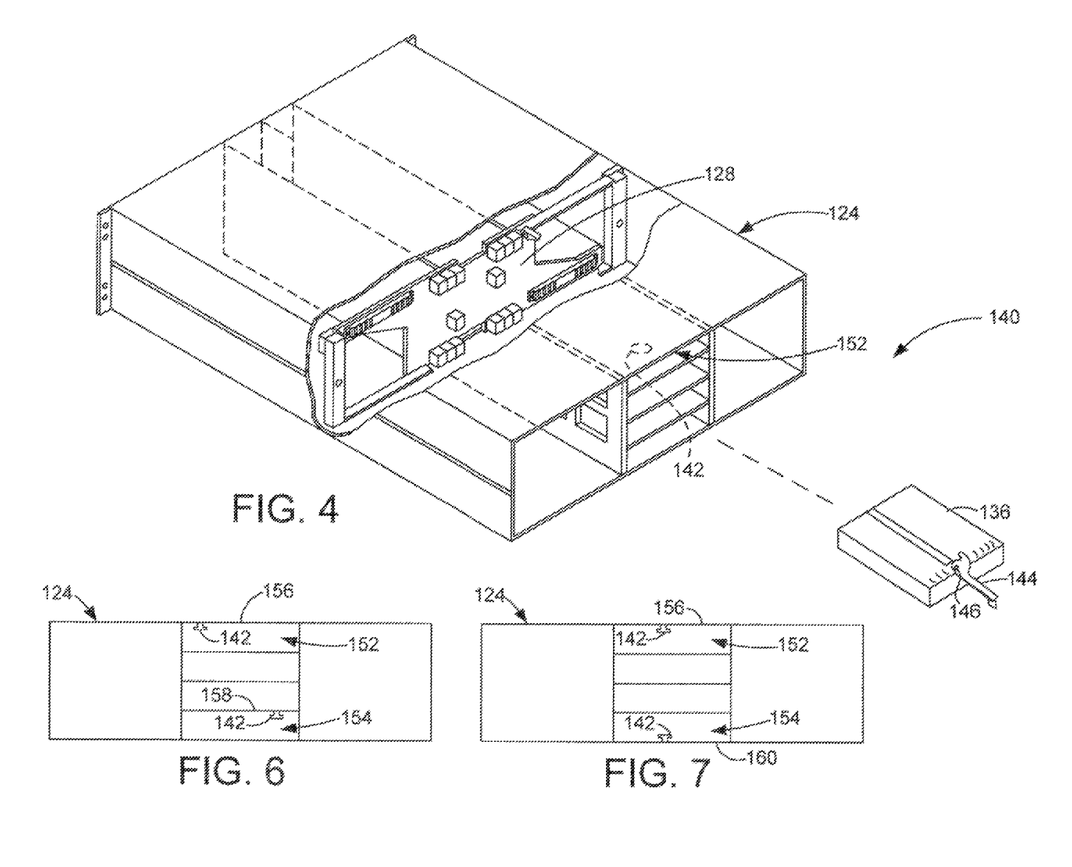
FIG. 4 is an enlarged detail of a portion of FIG. 3.
FIGS. 6 and 7 are diagrammatic views of illustrative ways of keying the openings for a preselected mating relationship with the respective modules.

Preferably, the modules have controlled insertion and retraction devices (sometimes referred to as "locking devices") for positively controlling the amount of force used in inserting and retracting the module into and out of electrical communication with the backplane 128. FIG. 4, for example, shows a locking device 140 for one of the interfaces 136. The locking device 140 comprises a fixed strike 142 supported by the shelf 124 and a latch 144 pivotally attached to the interface 136 at pivot 146.

Figure 5:
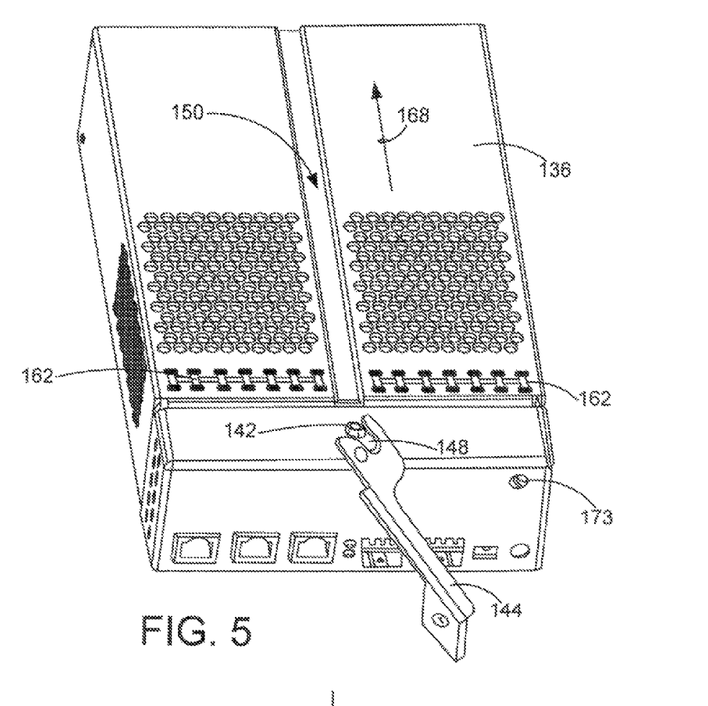
FIG. 5 is an isometric view of an interface module in the disengaged position.

FIG. 5 shows the latch 144 in an open position, whereat an open-ended slot 148 defined by the latch 144 clearingly disengages the strike 142. It will be noted in FIG. 5 the shelf 124 portion supporting the strike 142 is removed for clarity. Advantageous of the embodiments of the present invention is that the strike 142 can be used to define a keying (or "key") feature that clearingly engages a slot 150 defined by the interface 136 to define a preselected orientation of the interface 136 within the opening 152 of the shelf 124. Where two interfaces are used in the MDA 102, FIGS. 6 and 7 illustrate the manner in which a first key feature orientation can be used in the first opening 152 and a second key feature orientation different than the first key feature orientation can be used in a second opening 154. For example, FIG. 6 illustrates embodiments wherein the strikes 142 are fixed on different vertical planes on respective supports 156, 158 of the shelf 124. Alternatively, FIG. 7 illustrates embodiments wherein the strikes 142 are fixed on the same vertical plane but on opposing sides of the respective openings 152, 154 on respective supports 156, 160. In either event, the keying feature orientation and associated placement of the slot 150 (FIG. 5) in the module can be used to advantageously ensure that the module is placed in the desired opening, and in the desired orientation in the desired opening.

Figure 8:
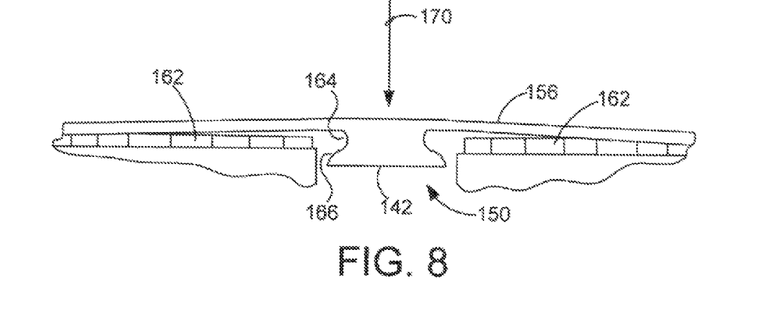
FIG. 8 is a partial elevational view of the interface module of FIG. 5.

Returning now to FIG. 5 and in further view of FIG. 8, the interface 136 supports a plurality of electromagnetic interference ("EMI") spring contacts 162 that are necessarily operatively compressingly engaged between the interface 136 and the shelf 124. The support members 156, 158, 160 that pressingly engage against the EMI contacts are preferably made from thin gauge, non-reinforced panels so as to minimize cost and maximize the internal size of the openings 152, 154. However, as shown in FIG. 8, such a thin-panel construction deflects away from and thus does not reliably compress against the EMI contacts 162.

Embodiments of the present invention resolve this problem by configuring the strike 142 to define a first engagement surface 164 and a nonplanar second engagement surface 166, both of which being simultaneously engageable by the latch 144. The first engagement surface 164 comprises a cylindrical surface extending substantially along the strike 142 longitudinal axis, and defines a diameter that is smaller than a width of the slot 148 of the latch 144 for passing into and out of receiving engagement therein. The second engagement surface 166 depends from a distal end of the first engagement surface 164, and defines a conical portion terminating at a distal end thereof defining a diameter larger than the width of the slot 148 in the latch 144.

Figure 9:
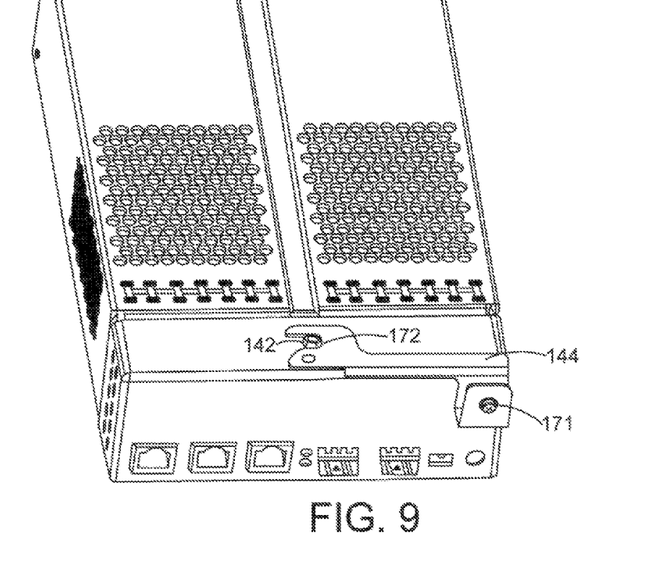
FIG. 9 is a view similar to FIG. 5 but with the interface module in the engaged position.

FIG. 9 shows the latch 144 in the closed position. As above in FIG. 5, the support 156 to which the strike 142 is fixed has been removed for clarity. Means can be provided for locking the latch 144 in the closed position, such as by a threaded fastener 171 supported by the latch 144 used to threadingly engage a threaded aperture 173 (FIG. 5) in the interface 136. Alternatively, other fastening means are contemplated such as but not limited to latches, hasps and the like.

Preferably, for maximum retention strength the latch 144 defines a closed end 172 of the slot 148 that is adapted for a close mating relationship with the strike 142 at the extent of the latch 144 pivotal movement.

Figure 10:
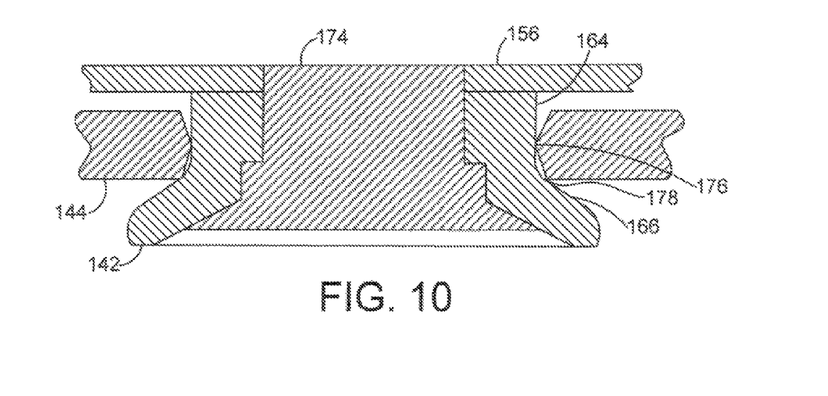
FIG. 10 is a cross sectional view of the latch contactingly engaging the strike in the engaged position of FIG. 9.
Figure 11:
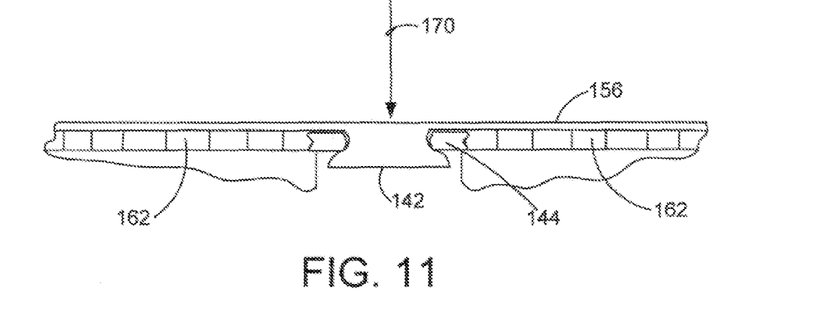
FIG. 11 is a partial elevational view of the interface module of FIG. 9.

As seen in FIG. 10, the strike 142 can be fixed to the support 156 of the shelf 124 by a mechanical fastener 174 such as but not limited to a rivet or a threaded fastener. Alternatively, the strike 142 can be otherwise fixed to the support 156 such as by a collar retainer or otherwise by material welding, brazing, interference fit or adhering. In other alternative embodiments, without limitation, the strike 142 can be unitarily formed as a portion of the shelf 124.

As best shown in FIG. 10, the first and second engagement surfaces 164, 166 define an obtuse-angled surface that is matingly engageable with the latch 144 for imparting a longitudinal insertion force on the interface 136 (in direction 168 of FIG. 5) for making an electrical connection, while simultaneously imparting a lateral retention force (in direction 170 of FIG. 8) on the support 156 of the cabinet 124 defining a preselected clearance between the interface 136 and the support 156 for adequately compressing the EMI contacts 162. Moving the latch 144 in the opposite direction, that is from the closed position to the open position, imparts the longitudinal force opposite to direction 168 for controlled retraction of the interface 136. In either event, the latch 144 contactingly engages against the strike 142 at contact point 176 in providing the longitudinal controlled insertion force 168 (FIG. 5) or opposite retraction force, and simultaneously contactingly engages against the strike 142 at contact point 178 in providing the lateral retention force 170 (FIG. 8).

Figure 12:
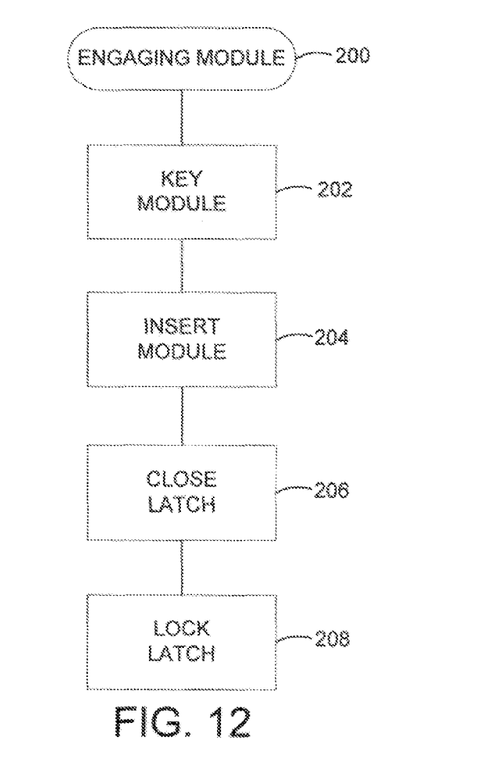
FIG. 12 is a flow chart of a method for ENGAGING MODULE illustrating steps for practicing embodiments of the present invention.

FIG. 12 is a flow chart of a method 200 for ENGAGING A MODULE illustrating steps for practicing embodiments of the present invention. In step 202 the size and placement of one or more strikes 142 are determined in order to key the openings (such as 152, 154) to a preselected location and orientation of the modules (such as interface 136). In step 204 the modules are inserted into the respective openings and brought into operative engagement with the locking device 140. In step 206 the locking device is moved to an engaged position for imparting the controlled insertion force 168 on an electrical connector portion of the electronic module, and for simultaneously imparting the retention force 170 urging the cabinet 124 in pressing engagement with an electromagnetic interference contact member 162 disposed between the module and the cabinet. In some embodiments this step is characterized by pivoting the latch member 144 into operable engagement with the fixed strike member 142 in the engaged position. In step 208 the latch 144 can be locked in the closed position.

Summarizing generally, a locking device (such as 140) is provided comprising a fixed strike (such as 142) and a pivotal latch (such as 144). The latch defines an open-ended slot (such as 148) that clearingly disengages the strike in an open position of the latch, and receivingly engages the strike in a closed position of the latch to pressingly engage against first (such as 164) and second (such as 166) nonplanar engagement surfaces of the strike. The first engagement surface can be disposed substantially parallel to a longitudinal axis of the strike, and define an obtuse included angle with the second engagement surface. In the closed position, the latch simultaneously imparts a longitudinal and a lateral force against the strike.

The strike can comprise a cylindrical portion defining a diameter smaller than a width of the slot, and a conical portion extending from an end of the cylindrical portion and terminating at a distal end in defining a diameter larger than the width of the slot. Preferably, the latch defines a closed end (such as 172) of the slot that is adapted for a close mating relationship with the strike at the extent of the latch pivotal movement.

In some embodiments a controlled insertion device is provided for securing an electronic module (such as 136) in a cabinet (such as 124). The device comprises the strike fixable to the cabinet and the latch engageable with the strike for imparting a longitudinal insertion force (such as 168) on the module for making an electrical connection, while simultaneously imparting a lateral retention force (such as 170) on the cabinet defining a preselected clearance between the module and the cabinet. The lateral retention force can compressingly engage the cabinet against an electromagnetic interference contact member disposed between the module and the cabinet.

The latch can be pivotal between an open position and a closed position, wherein the latch is clearingly disengageable from the strike in the open position and receivingly engageable with the strike in the closed position. The latch can define an open-ended slot adapted for passing the strike into and out of receiving engagement with the latch. Preferably, the latch defines a closed end of the slot adapted for a close mating relationship with the strike at the extent of the latch pivotal movement.

The strike can define a key feature clearingly engaging a slot of the module in a preselected orientation of the module in the cabinet permitting inserting the module in the cabinet. Where more than one module is employed, a first strike can define a first key feature orientation in a first opening in the cabinet and a second strike can define a second key feature orientation different than the first key feature orientation in a second opening in the cabinet.

The strike can comprise a cylindrical contact surface of a diameter smaller than a slot width and for bearing the longitudinal force, and a conical contact surface depending from one end of the cylindrical surface and terminating in a diameter greater than the slot width for bearing the lateral retention force.

In some embodiments a cabinet is provided establishing electromagnetic interference shielding by steps for engaging an electronic module within a cabinet opening. The steps for engaging can be characterized by keying the electronic module with respect to a preselected orientation in the cabinet opening (such as 202). The steps for engaging can be characterized by inserting the electronic module into the cabinet opening to bring a locking means into operable engagement (such as 204). The steps for engaging can be characterized by moving the locking means to an engaged position for imparting a controlled insertion force on an electrical connector portion of the electronic module and for simultaneously imparting a retention force urging the cabinet in pressing engagement with an electromagnetic interference contact member disposed between the module and the cabinet (such as 206). The steps for engaging can characterized by pivoting a latch member into operable engagement with a fixed strike member in the engaged position. The steps for engaging can be characterized by securing the latch in the engaged position (such as 208).

It is to be understood that even though numerous characteristics and advantages of various embodiments of the present invention have been set forth in the foregoing description, together with the details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the arrangement and placement of the strike and the latch without departing from the scope and spirit of the present invention. In addition, although the preferred embodiments described herein are directed to a data writing device, it will be appreciated by those skilled in the art that the teachings of the present invention can be applied to other systems without departing from the spirit and scope of the present invention.

It will be clear that the present invention is well adapted to attain the ends and advantages mentioned as well as those inherent therein. While presently preferred embodiments have been described for purposes of this disclosure, numerous changes may be made which readily suggest themselves to those skilled in the art and which are encompassed in the spirit of the invention disclosed and as defined in the appended claims.

What is claimed is:

1. A device comprising:
a shelf surface defining an opening and supporting a first strike defining a first key orientation extending into the opening and a second strike defining a different second key orientation in a second opening; and
a module sized for insertion into the opening so that a module side of a portion of the module in the opening facingly opposes the shelf surface, the module supporting a latch having an open mode that clearingly disengages the first strike, and a closed mode that contactingly engages the first strike and thereby imparts a longitudinal insertion force on the module and simultaneously imparts a lateral retention force urging the shelf surface entirely toward the module side to define a desired gap in the facing opposition between the shelf surface and the module side.

2. The device of claim 1 wherein the latch defines an open-ended slot adapted for passing the first strike into and out of receiving engagement with the latch.

3. The device of claim 2 wherein the latch defines a closed end of the slot defining a close mating relationship with the first strike at the extent of a latch pivotal movement.

4. The device of claim 2 wherein the first strike comprises a cylindrical contact surface of a diameter smaller than a slot width bearing the longitudinal force, and a conical contact surface depending from one end of the cylindrical surface and terminating in a diameter greater than the slot width bearing the lateral retention force.

5. The device of claim 1 wherein the first strike defines a key feature that clearingly engages a slot of the module in a preselected orientation of the module in the opening.

6. The device of claim 1 wherein the insertion force urges a connector portion of the module into an operable connection.

7. The device of claim 1 further comprising an electromagnetic interference contact operably compressed in the desired gap.

* * * * *